United States Patent
Rigsby et al.

(10) Patent No.: US 12,456,621 B2
(45) Date of Patent: Oct. 28, 2025

(54) INERT GAS IMPLANTATION FOR HARD MASK SELECTIVITY IMPROVEMENT

(71) Applicant: Lam Research Corporation, Fremont, CA (US)

(72) Inventors: Daniela Anjos Rigsby, Tualatin, OR (US); Ragesh Puthenkovilakam, Portland, OR (US); Alice G. Hollister, Houston, TX (US); Lie Zhao, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 420 days.

(21) Appl. No.: 17/997,697

(22) PCT Filed: Apr. 22, 2021

(86) PCT No.: PCT/US2021/028588
§ 371 (c)(1),
(2) Date: Nov. 1, 2022

(87) PCT Pub. No.: WO2021/225790
PCT Pub. Date: Nov. 11, 2021

(65) Prior Publication Data
US 2023/0223263 A1 Jul. 13, 2023

Related U.S. Application Data

(60) Provisional application No. 63/020,370, filed on May 5, 2020.

(51) Int. Cl.
*H01L 21/033* (2006.01)
*C23C 16/26* (2006.01)
(Continued)

(52) U.S. Cl.
CPC .......... *H01L 21/0337* (2013.01); *C23C 16/26* (2013.01); *C23C 16/50* (2013.01);
(Continued)

(58) Field of Classification Search
None
See application file for complete search history.

(56) References Cited

U.S. PATENT DOCUMENTS

| | | |
|---|---|---|
| 2011/0287633 A1 | 11/2011 | Lee et al. |
| 2012/0129351 A1 | 5/2012 | Konecni et al. |

(Continued)

FOREIGN PATENT DOCUMENTS

| | | | |
|---|---|---|---|
| JP | 2002194547 A | 7/2002 | |
| JP | 2007523034 A | 8/2007 | |

(Continued)

OTHER PUBLICATIONS

D.G. McCulloch et al., "Ab initio simulations of the structure of amorphous carbon", Phys. Rev. B, vol. 61, year 2000, pp. 2349-2355.*

(Continued)

*Primary Examiner* — Jiong-Ping Lu
(74) *Attorney, Agent, or Firm* — Weaver Austin Villeneuve & Sampson LLP

(57) ABSTRACT

An amorphous carbon hard mask is formed having low hydrogen content and low sp3 carbon bonding but high modulus and hardness. The amorphous carbon hard mask is formed by depositing an amorphous carbon layer at a low temperature in a plasma deposition chamber and treating the amorphous carbon layer to a dual plasma-thermal treatment. The dual plasma-thermal treatment includes exposing the amorphous carbon layer to inert gas plasma for implanting an inert gas species in the amorphous carbon layer and exposing the amorphous carbon layer to a high temperature. The amorphous carbon hard mask has high etch selectivity relative to underlying materials.

14 Claims, 10 Drawing Sheets

(51) Int. Cl.
  *C23C 16/50* (2006.01)
  *C23C 16/56* (2006.01)
  *H01J 37/32* (2006.01)
  *H01L 21/02* (2006.01)
  *H01L 21/311* (2006.01)

(52) U.S. Cl.
  CPC ........ *C23C 16/56* (2013.01); *H01J 37/32926* (2013.01); *H01L 21/02115* (2013.01); *H01L 21/02274* (2013.01); *H01L 21/0234* (2013.01); *H01L 21/02592* (2013.01); *H01L 21/0332* (2013.01); *H01L 21/31116* (2013.01); *H01L 21/31144* (2013.01); *H01J 2237/332* (2013.01); *H01J 2237/334* (2013.01)

(56) References Cited

U.S. PATENT DOCUMENTS

| | | | |
|---|---|---|---|
| 2018/0051368 A1 | 2/2018 | Liu et al. | |
| 2018/0337046 A1* | 11/2018 | Shamma | H01L 21/0338 |
| 2019/0172714 A1* | 6/2019 | Bobek | H01L 21/0335 |
| 2019/0393034 A1 | 12/2019 | Venkatasubramanian et al. | |
| 2020/0135485 A1 | 4/2020 | Uvais et al. | |

FOREIGN PATENT DOCUMENTS

| | | |
|---|---|---|
| JP | 2012051793 A | 3/2012 |
| JP | 2019529695 A | 10/2019 |
| KR | 20190032636 A | 3/2019 |
| WO | WO-2019108376 A1 | 6/2019 |

OTHER PUBLICATIONS

International Preliminary Report on Patentability and written opinion dated Nov. 17, 2022 in Application PCT/US2021/028588.

International Search Report and Written Opinion dated Aug. 6, 2021 in Application No. PCT/US2021/028588.

JP Office Action dated Dec. 3, 2024 in JP Application No. 2022-566325, with English Translation.

KR Office Action dated Feb. 21, 2025 in KR Application No. 10-2022-7042487, with English Translation.

* cited by examiner

INERT GAS IMPLANTATION FOR HARD MASK SELECTIVITY IMPROVEMENT

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

FIELD

Implementations herein relate to methods of forming hard mask materials for semiconductor devices and, more particularly, to treatment of amorphous carbon for improving a selectivity of an amorphous carbon hard mask.

BACKGROUND

Semiconductor fabrication processes can involve fabrication of memory and logic devices. Examples include 3D NAND and DRAM (dynamic random-access memory) applications, as well as logic applications for mid-end-of-line (MEOL) and back-end-of-line (BEOL) processes. Fabrication of memory and logic devices often involves etching features of a substrate, which may include multiple layers of materials. As device dimensions become smaller, etching features through multiple layers of materials becomes more challenging.

To create vertical patterns in semiconductor devices, masks are needed as sacrificial layers in lithographic patterning. The vertical patterns are often created by a plasma-based etching process. As aspect ratios in semiconductor devices increase, masks require higher etch selectivity to resist the plasma-based etching processes. A hard mask is generally more etch resistant to plasma reactive gases than conventional organic soft masks for deeper patterning. The important properties of a hard mask may include etch resistance, compressive stress, mechanical properties, and removability. Amorphous carbon is a promising material for a hard mask especially for high aspect ratio patterning. An amorphous carbon hard mask is an example of an ashable hard mask (AHM).

The background provided herein is for the purposes of generally presenting the context of the disclosure. Work of the presently named inventors, to the extent that it is described in this background, as well as aspects of the description that may not otherwise qualify as prior art at the time of filing, are neither expressly nor impliedly admitted as prior art against the present disclosure.

SUMMARY

Provided herein is a method of preparing an amorphous carbon hard mask. The method includes (i) depositing amorphous carbon material on a substrate in a plasma deposition chamber at a deposition temperature, (ii) exposing the amorphous carbon material to an inert gas plasma at an elevated treatment temperature greater than the deposition temperature in the plasma deposition chamber, and (iii) repeating operations (i) and (ii) to achieve a desired thickness for an amorphous carbon hard mask.

In some implementations, the inert gas plasma includes ions and/or radicals of helium, neon, argon, krypton, or xenon. In some implementations, the elevated treatment temperature is greater than the deposition temperature by a percentage increase between about 10% and about 550% from the deposition temperature. In some implementations, the amorphous carbon material has a hydrogen content of at least about 20 atomic % prior to exposure to the inert gas plasma and the elevated treatment temperature. In some implementations, exposing the amorphous carbon material to the inert gas plasma and the elevated treatment temperature reduces the hydrogen content by at least about 5 atomic %. In some implementations, exposing the amorphous carbon material to the inert gas plasma and the elevated treatment temperature increases an etch resistance of the amorphous carbon hard mask. In some implementations, exposing the amorphous carbon material to the inert gas plasma and the elevated treatment temperature reduces sp3 carbon bonding in the amorphous carbon material. In some implementations, exposing the amorphous carbon material to the inert gas plasma and the elevated treatment temperature maintains a hardness within ±20% of an original hardness of the amorphous carbon material and maintains a Young's modulus within ±20% of an original Young's modulus of the amorphous carbon material. In some implementations, the amorphous carbon hard mask has a hydrogen content equal to or less than about 20 atomic %. In some implementations, the amorphous carbon hard mask is doped with an inert gas at a dopant concentration of at least about 0.1 atomic %. In some implementations, the method further includes (iv) patterning the amorphous carbon material to form the amorphous carbon hard mask, and (v) etching one or more underlayers positioned below the amorphous carbon hard mask using a plasma-based etchant.

Another aspect involves an amorphous carbon hard mask. The amorphous carbon hard mask includes a hydrogen content equal to or less than about 20 atomic %, an amount of sp3 carbon bonding equal to or less than about 25%, a Young's modulus between about 120 GPa and about 180 GPa, and a hardness between about 10 GPa and about 20 GPa.

In some implementations, the amorphous carbon hard mask further includes an inert gas species, where a dopant concentration of the inert gas species is at least about 0.1 atomic %. In some implementations, the inert gas species includes argon. In some implementations, the amorphous carbon hard mask is formed by: (i) depositing an amorphous carbon material on a substrate in a plasma deposition chamber at a deposition temperature, (ii) exposing the amorphous carbon material to an inert gas plasma at an elevated treatment temperature greater than the deposition temperature in the plasma deposition chamber, and (iii) repeating operations (i) and (ii) to achieve a desired thickness.

Another aspect involves a plasma deposition apparatus. The plasma deposition apparatus includes a processing chamber, a substrate support for supporting a substrate in the processing chamber, where the substrate support is configured to be heated and biased, and a controller configured with instructions to perform the following operations: (i) deposit an amorphous carbon material on the substrate in the processing chamber at a deposition temperature, (ii) expose the amorphous carbon material to an inert gas plasma at an elevated treatment temperature greater than the deposition temperature in the processing chamber, and (iii) repeat operations (i) and (ii) to achieve a desired thickness for an amorphous carbon hard mask.

In some implementations, the elevated treatment temperature is greater than the deposition temperature by a percentage increase between about 10% and about 550% from the deposition temperature. In some implementations, the amorphous carbon material has a hydrogen content of at least about 20 atomic % prior to exposure to the inert gas plasma and the elevated treatment temperature. In some implementations, the amorphous carbon hard mask has a hydrogen content equal to or less than about 20 atomic %.

These and other aspects are described further below with reference to the drawings.

DETAILED DESCRIPTION

Figure 1A:
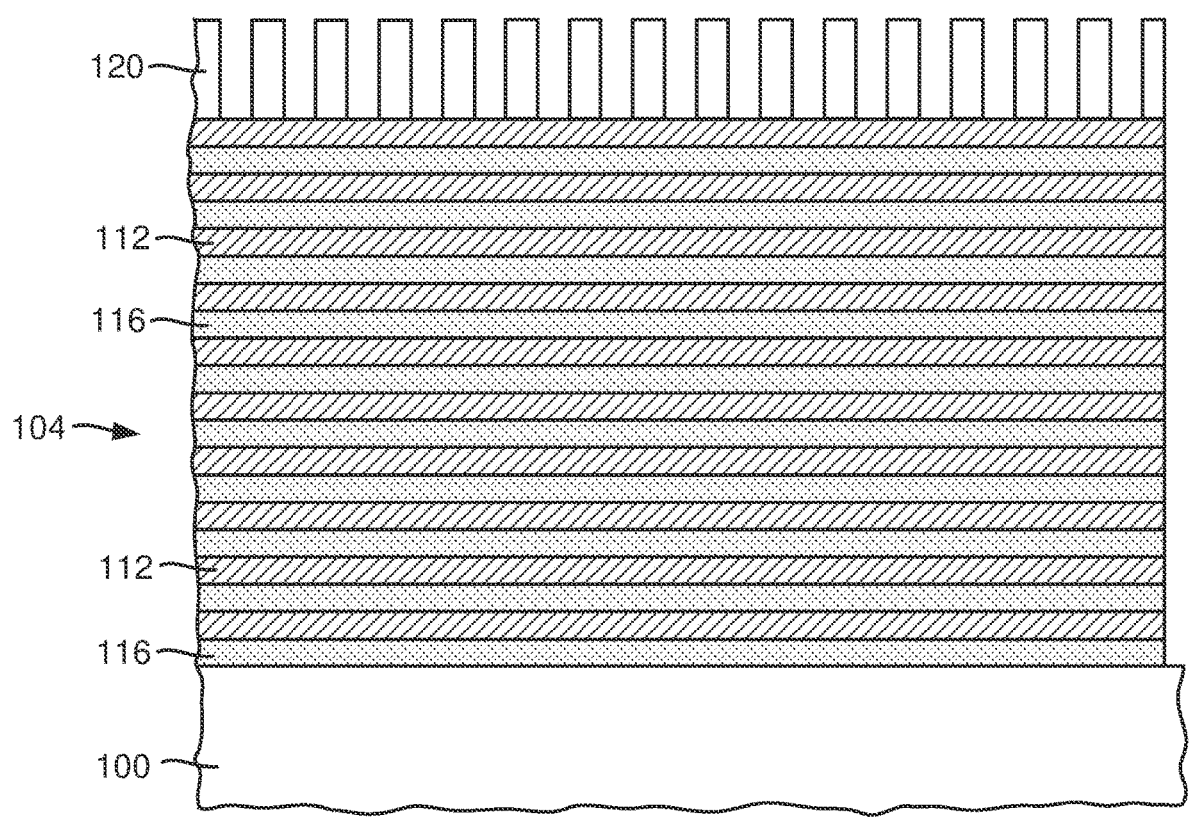
FIG. 1A shows a cross-sectional schematic illustration of an example partially fabricated semiconductor device having an amorphous carbon hard mask formed over alternating layers of materials.

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards and the like.

Introduction

In various semiconductor processing schemes, features are etched into stacks of materials. Example applications include but are not limited to logic and memory applications, which include DRAM and 3D NAND applications. The stacks of materials may include one or more layers of dielectric material, and the one or more layers of dielectric material may include alternating layers of materials. An example of alternating layers of materials can include alternating layers of oxide and nitride, or alternating layers of oxide and polysilicon. As the aspect ratio of features continues to increase, it becomes increasingly challenging to etch such features. "Features" as used herein may describe negative features such as contact holes, openings, recesses, trenches, or vias. A feature typically has an aspect ratio (depth to lateral dimension).

High aspect ratio etches are common in many semiconductor device applications, especially in logic and memory device applications. Logic and memory devices may have features with aspect ratios of at least 10:1, at least 20:1, at least 30:1, at least 50:1, or at least 75:1. A mask is used to transfer a pattern to underlayers of a substrate. When performing high aspect ratio etches, both mask and underlayers are exposed to etchant, which preferentially etches away the underlayers. A mask with high etch selectivity is important to successfully transferring patterns to the underlayers. Otherwise, over the course of etching high aspect ratio features, the mask can be worn away. In addition, the mask should exhibit low stress and strong mechanical properties. Lower stress generally reduces or eliminates undesirable substrate bowing after mask deposition whereas increased hardness generally reduces undesirable line bending of high aspect ratio features after the mask is opened. Ashable hard masks have high etch selectivity and may be removed by ashing, plasma ashing, or dry stripping. Amorphous carbon (a-C) hard masks are a common type of ashable hard masks.

Amorphous carbon hard masks are generally composed of carbon and hydrogen with, optionally, a trace amount of one or more dopants. The bonding structure of the amorphous carbon hard mask can vary from sp2 (graphite-like) to sp3 (diamond-like), or a combination of both. An amorphous carbon hard mask is a composite of crystalline diamond which has sp3 hybridized orbitals and graphite which has sp2 hybridized orbitals. Generally speaking, the composition and bonding structure of the amorphous carbon hard mask may be tuned by controlling various conditions and processing parameters during deposition. In turn, the properties of the hard mask, including etch selectivity, density, compressive stress, mechanical properties, optical properties, and removability may be impacted. Such properties may be correlated with one or both of the hard mask's composition and bonding structure. As feature sizes decrease and aspect ratios increase in semiconductor device applications, amorphous carbon hard masks need to exhibit increased etch selectivity.

FIG. 1A shows a cross-sectional schematic illustration of an example partially fabricated semiconductor device having an amorphous carbon hard mask formed over alternating layers of materials. Alternating layers of materials may be characteristic of semiconductor devices such as memory and logic devices. A film stack 104 may be formed on a substrate 100, where the film stack 104 includes alternating layers of materials. The alternating layers of materials may include multiple layers of a first material 112 and multiple layers of a second material 116 alternatingly disposed or interleaved between the multiple layers of the first material 112. The layers of the first material 112 can include a nitride such as silicon nitride. Alternatively, the layers of the first material 112 can include polysilicon or other semiconducting material such as germanium. The layers of the second material 116 can include an oxide such as silicon oxide. However, it will be understood that the alternating layers may be reversed so that the layers of the first material 112 can include an oxide and the layers of the second material 116 can include a nitride or polysilicon. In some implementations, each of the layers of the first material 112 and the layers of the second material 116 can have a thickness between about 5 nm and about 100 nm, between about 10 nm and about 50 nm, or between about 15 nm and about 35 nm. Alternating layers of oxide and nitride may be referred to as an ONON stack and alternating layers of oxide and polysilicon may be referred to as an OPOP stack, either of which may have many layers. The total number of layers in the film stack 104 may be 80 layers or higher or 100 layers or higher. Lower numbers of layers may also be used, such as 80, 40, 20, 10, or fewer.

An amorphous carbon hard mask 120 may be deposited over the film stack 104. The amorphous carbon hard mask 120 may be deposited using any suitable deposition technique such as plasma-enhanced chemical vapor deposition (PECVD). The amorphous carbon hard mask 120 may be patterned with one or more openings. The amorphous carbon hard mask 120 may be patterned using conventional lithography techniques. The amorphous carbon hard mask 120 may be patterned to define where features are to be etched. In some implementations, a thickness of the amorphous carbon hard mask 120 may be at least 2% to 50% of the total thickness of the film stack 104. For example, a thickness of the amorphous carbon hard mask 120 may be between about 5 nm and about 1500 nm, between about 10 nm and about 1000 nm, or between about 10 nm and about 500 nm.

Figure 1B:
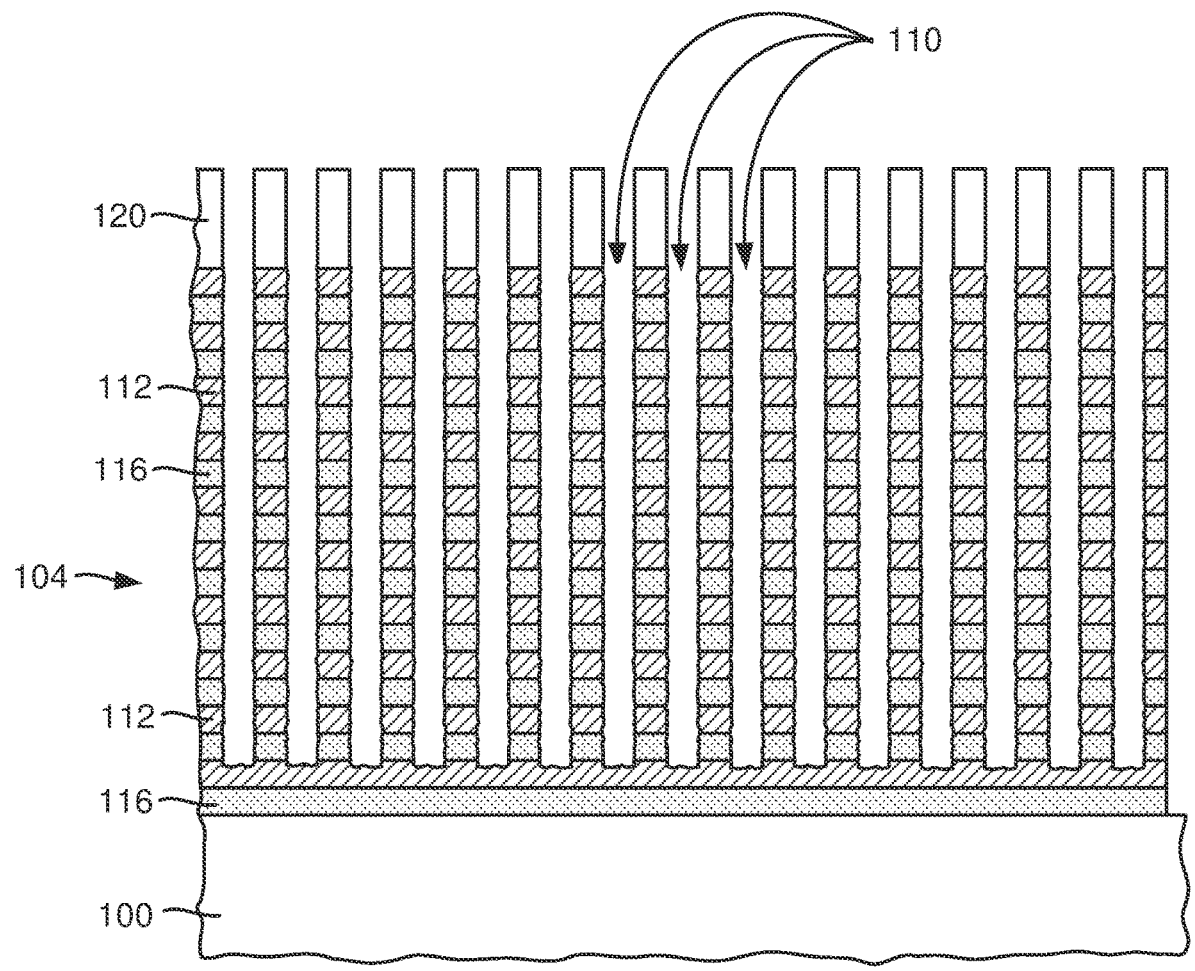
FIG. 1B shows a cross-sectional schematic illustration of the partially fabricated semiconductor device in FIG. 1A after performing a plasma etch through the alternating layers of materials.

FIG. 1B shows a cross-sectional schematic illustration of the partially fabricated semiconductor device in FIG. 1A after performing a plasma etch through the alternating layers of materials. A plurality of features 110 are etched through the layers of the first material 112 and the layers of the second material 116. Each of the etched features 110 may have a shape of a cylinder, though it will be understood that each of the etched features 110 may have alternative geometric shapes such as rectangles, squares, or other polygonal recesses, trenches, etc. The plurality of features 110 may be recesses, holes, or openings that extend through one or more layers of the film stack 104, where the plurality of features 110 are defined by the amorphous carbon hard mask 120. The plurality of features 110 may be high aspect ratio features with a depth to lateral dimension aspect ratio of at least about 10:1, at least about 20:1, at least about 30:1, at least about 40:1, at least about 50:1, or at least about 100:1. For example, a cylindrical hole having a depth of 2 μm and a diameter of 50 nm has an aspect ratio of 40:1.

The plurality of features 110 may be formed using a plasma-based etch. The plasma-based etch may be selective to at least the layers of the first material 112 and the layers of the layers of the second material 116 but non-selective to the amorphous carbon hard mask 120. In other words, the plasma-based etch will etch through the first material 112 and the second material 116 at a high etch rate whereas the plasma-based etch will etch through the amorphous carbon hard mask 120 at a low etch rate. In some implementations, the plasma-based etch may have a chemistry that includes one or more fluorocarbons ($C_xF_y$). In some implementations, one or more co-reactants may also be provided. For instance, the plasma-based etch may have a chemistry that includes a combination of fluorocarbons and oxygen ($O_2$). One example of such a chemistry can include $C_4F_8$, $C_4F_6$, $N_2$, CO, $CF_4$, and $O_2$. Another example of such a chemistry can include $C_4F_8$, $C_4F_6$, $CH_2F_2$, $CO_4$, and $O_2$. Other chemistries may be used. Suitable examples of etchants include but are not limited to $CF_4CHF_3$, HBr, $BCl_3$, $NF_3$, and $Cl_2$, among others. The chemistry of the plasma-based etch may be reactive with the layers of the first material 112 and the layers of the second material 116 but unreactive with the amorphous carbon hard mask 120.

The plasma-based etch process may etch through multiple layers of the first material 112 and multiple layers of the second material 116 to a desired depth to form the plurality of features 110. The total etch depth may depend on the particular application. For some cases, (e.g., DRAM), the total etch depth for each of the plurality of features 110 may be between about 1.5 μm and about 2.0 μm. For other cases (e.g., 3D NAND), the total etch depth for each of the plurality of features 110 may be between about 3.0 μm and about 5.0 μm.

Various strategies exist for improving an etch selectivity of an amorphous carbon hard mask. Generally, the strategies involve modifying one or more film properties of the amorphous carbon hard mask, where the one or more film properties include but are not limited to hydrogen content, density, and ratio of sp3 to sp2 carbon bonding. For instance, the etch selectivity of the amorphous carbon hard mask can be increased by reducing the hydrogen content. In addition or in the alternative, the etch selectivity of amorphous carbon hard mask can be increased by increasing density. The density of the amorphous carbon hard mask may be correlated with other properties such as the hard mask's hardness, refractive index, extinction coefficient, and Young's modulus. As used herein, a Young's modulus of a material may simply be referred to as its "modulus." In addition or in the alternative, the etch selectivity of the amorphous carbon hard mask can be increased by increasing an amount of sp3 carbon bonding in the hard mask. Increased sp3 carbon bonding is typically associated with higher density.

Increased etch selectivity by reducing hydrogen content in the amorphous carbon hard mask has been typically achieved by minimizing hydrogen during deposition. Amorphous carbon can be deposited by CVD, PECVD, ion beam deposition, or other suitable deposition technique. Amorphous carbon can be deposited using a hydrocarbon precursor such as methane ($CH_4$), acetylene ($C_2H_2$), or ethane ($C_2H_6$) with a carrier gases such as helium (He). To minimize hydrogen content, a hydrocarbon precursor is chosen with the least amount of hydrogen content. An example of such a hydrocarbon precursor is acetylene. In addition to selecting a hydrocarbon precursor with the least amount of hydrogen content, the hydrogen content in the amorphous carbon hard mask can be further reduced by increasing temperature during or after deposition. Exposing the hard mask to an elevated temperature can extract hydrogen out of the hard mask. However, the elevated temperature simultaneously causes the hard mask to have an increased amount of sp2 carbon bonding so that the hard mask becomes more graphitic. As a result, mechanical properties such as the modulus and hardness of the hard mask are reduced.

Diamond-like carbon is typically used as an amorphous carbon hard mask more than other types of amorphous carbon materials because it has higher sp3 bonding hybridization. Diamond-like carbon can have a high modulus (e.g., at least 100 GPa), high hardness (e.g., 10-30 GPa), and high density (e.g., at least 1.6 g/cm$^3$). However, the hydrogen content in diamond-like carbon can be significant, where the hydrogen content in diamond-like carbon is usually over 25 atomic %.

The present disclosure relates to inert gas plasma treatment combined with thermal treatment of amorphous carbon layers in preparing an amorphous carbon hard mask. An amorphous carbon layer is deposited at low temperature in a plasma deposition chamber. The amorphous carbon layer is exposed to inert gas plasma at high temperature in the same plasma deposition chamber. Low temperature deposition of amorphous carbon and dual plasma-thermal treatment are repeated until a desired thickness is achieved. The resulting amorphous carbon hard mask has a significantly reduced hydrogen content and increased sp2 carbon bonding, but surprisingly high hardness and high modulus. The amorphous carbon hard mask has increased etch selectivity in comparison to conventional diamond-like carbon films.

Figure 2:
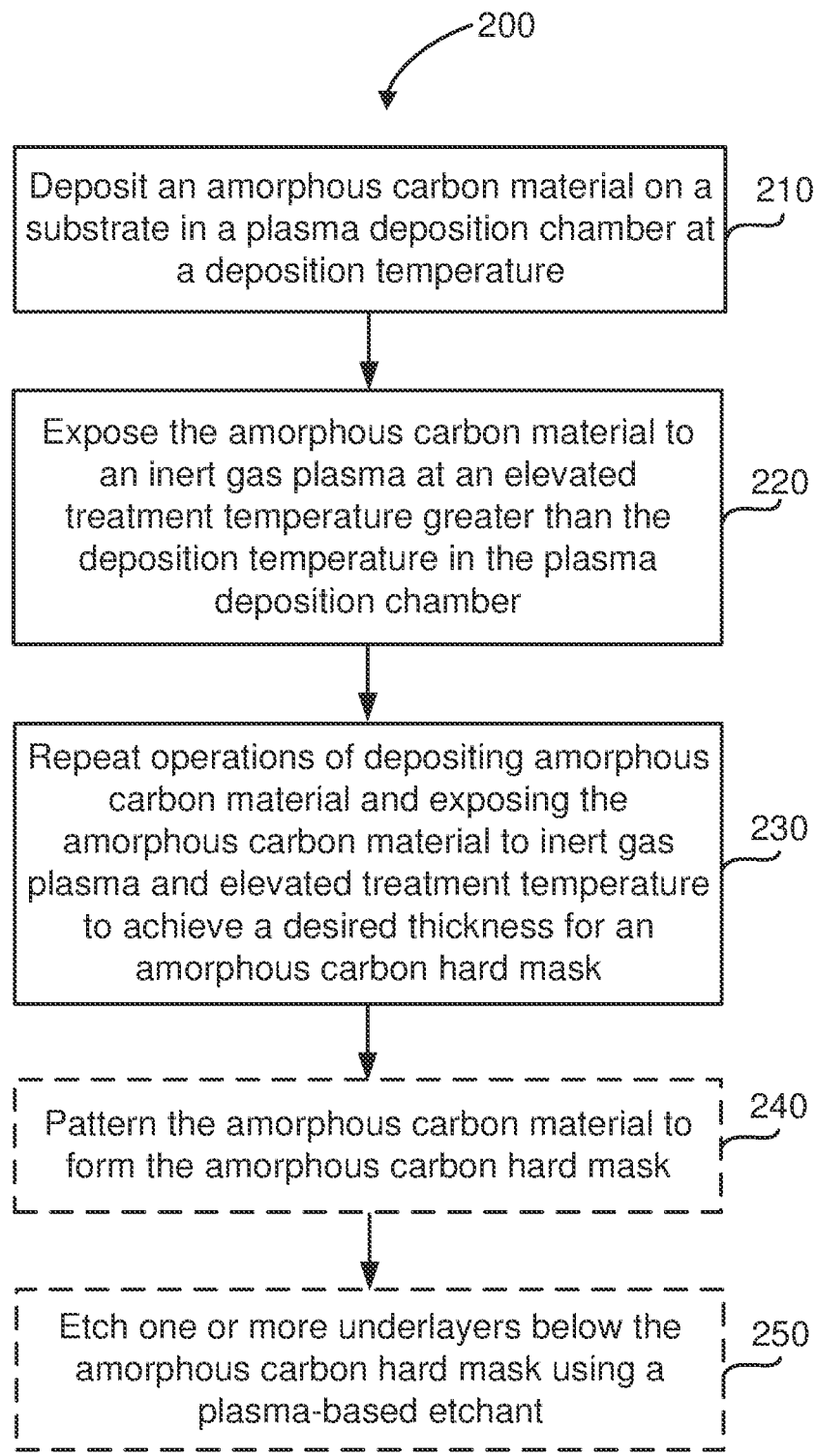
FIG. 2 shows a flow diagram of an example method of preparing an amorphous carbon hard mask according to some implementations.

FIG. 2 shows a flow diagram of an example method of preparing an amorphous carbon hard mask. The operations in a process 200 may be performed in different orders and/or with different, fewer, or additional operations. In some implementations, the operations in the process 200 may be performed in an apparatus configured for plasma-based deposition such as a PECVD reactor. Specifically, deposition and treatment operations may be performed in the same chamber or same tool platform. Examples of such chambers or tool platforms are described in FIGS. 7-8. Examples of PECVD reactors include the Sequel™ and Vector™ reactors produced by and available from Lam Research Corporation of Fremont, CA The operations in the process 200 of FIG. 2 may be described with reference to FIGS. 3A-3D.

At block 210 of the process 200, an amorphous carbon material is deposited on a substrate in a plasma deposition chamber at a deposition temperature. The amorphous carbon material is deposited over one or more underlayers of the substrate. In some implementations, the one or more underlayers may include at least 10 underlayers, at least 20 underlayers, at least 30 underlayers, at least 40 underlayers, at least 50 underlayers, at least 60 underlayers, at least 70 underlayers, or at least 80 underlayers. In some implementations, the substrate may be a silicon wafer, such as a 200-mm wafer, 300-mm wafer, or 450-mm wafer. The substrate includes the one or more underlayers, where the one or more underlayers may include one or more dielectric layers. In some implementations, the substrate may include alternating layers of materials. For example, the substrate may include alternating layers of nitride and oxide to form an ONON stack, or the substrate may include alternating layers of polysilicon and oxide to form an OPOP stack.

Only a limited thickness of the amorphous carbon material is deposited prior to treatment. That way, the thickness does not significantly exceed depth penetration of implantation of inert gas species during plasma treatment. If the amorphous carbon material is too thick, then the inert gas species would be unable to reach certain depths in the amorphous carbon material for implantation. In some implementations, a thickness of the amorphous carbon material is between about 1 nm and about 10 nm.

The amorphous carbon material may be deposited using a suitable deposition technique such as PECVD. During deposition, a process gas including a hydrocarbon precursor is flowed towards the substrate. The hydrocarbon precursor may be defined by the formula $C_xH_y$, where x is an integer between 2 and 10, and y is an integer between 2 and 24. Example hydrocarbon precursors include methane ($CH_4$), acetylene ($C_2H_2$), ethylene ($C_2H_4$), propylene ($C_3H_6$), butane ($C_4H_{10}$), cyclohexane ($C_6H_{12}$), benzene ($C_6H_6$), and toluene ($C_7H_8$). In some implementations, the hydrocarbon precursor is acetylene. Precursor flow rates may depend on the particular deposition chamber and substrate. In some implementations, a flow rate of the hydrocarbon precursor is between about 40 sccm and about 1000 sccm, between about 80 sccm and about 500 sccm, or between about 100 sccm and about 300 sccm.

In addition to hydrocarbon precursors, a carrier gas may be used to dilute the precursor gas flow. In some implementations, the carrier gas may include helium (He), argon (Ar), nitrogen ($N_2$), hydrogen ($H_2$), or a combination thereof. In some implementations, a carrier gas flow rate may be between about 1000 sccm and about 20000 sccm or between about 1500 sccm and about 12000 sccm.

Pressure may be controlled in the plasma deposition chamber during deposition. In some implementations, a pressure in the plasma deposition chamber may be between about 0.1 Torr and about 20 Torr, or between about 0.2 Torr and about 12 Torr.

A deposition temperature for depositing the amorphous carbon material may be controlled to influence characteristics of the amorphous carbon material. The deposition temperature can affect stress, modulus, hardness, density, refractive index, hydrogen content, and ratio of sp3 to sp2 carbon bonding, among other properties. Higher temperatures thermodynamically favor more sp2 carbon bonding. The amorphous carbon material is deposited at a low deposition temperature. In some implementations, amorphous carbon material is deposited at a deposition temperature between about 50° C. and about 350° C., between about 100° C. and about 275° C., or between about 100° C. and about 225° C. In some implementations, the deposition temperature can be adjusted by controlling a substrate support temperature.

The amorphous carbon material is deposited by igniting plasma using an RF power source. In some implementations, the RF power source includes a low frequency (LF) component and a high frequency (HF) component. Low frequency can refer to an RF frequency between about 100 kHz and about 2 MHz, and high frequency can refer to an RF frequency between about 2 MHz and about 60 MHz. In some implementations, the low frequency component applies a power between about 300 W and about 2000 W. In some implementations, the high frequency component applies a power between about 50 W and about 1000 W.

Table I shows an example of deposition conditions and parameters for depositing an amorphous carbon material. The amorphous carbon material may be a type of diamond-like carbon film with higher modulus and refractive index.

TABLE I

| Parameters | Values |
| --- | --- |
| $C_2H_2$ (sccm) | 100-300 |
| Ar (sccm) | 1500-12000 |
| $N_2$ (sccm) | 1500-12000 |
| Pressure (Torr) | 0.2-12 |
| Temperature (° C.) | 100-225 |
| RF HF (W) | 50-1000 |
| RF LF (W) | 300-2000 |

The deposited amorphous carbon material prior to treatment may have a hydrogen content of at least 20 atomic %, between about 20 atomic % and about 50 atomic %, or between about 20 atomic % and about 30 atomic %. Typically, diamond-like carbon films have a hydrogen content greater than about 20 atomic %, such as 28 atomic %. Though diamond-like carbon films usually have high modulus and hardness, the diamond-like carbon films also have high hydrogen content. In some implementations, the deposited amorphous carbon material may be a highly selective and transparent (HST) amorphous carbon. Such HST amorphous carbon materials may have a high etch selectivity and high transparency, where an extinction coefficient may be less than about 0.1. Details regarding deposition of HST amorphous carbon materials can be described in U.S. patent application Ser. No. 11/449,983, filed Jun. 8, 2006, and entitled "METHODS OF DEPOSITING HIGHLY SELECTIVE TRANSPARENT ASHABLE HARDMASK FILMS," now U.S. Pat. No. 7,981,810, which is incorporated herein by reference in its entirety and for all purposes. In some implementations, the deposited amorphous carbon material may be any low temperature amorphous carbon. Such low temperature amorphous carbon may be deposited at temperatures between about 150° C. and about 400° C. It will be understood by a person of ordinary skill in the art that other types of amorphous carbon materials may be deposited at block 210.

The deposited amorphous carbon material prior to treatment may have a significant percentage of sp3 carbon bonding. In some implementations, sp3 carbon bonding in the deposited amorphous carbon material is at least about 25%, between about 25% and about 60%, or between about 30% and about 50%. For example, a percentage of sp3 carbon bonding in diamond-like carbon films can be 40%.

The deposited amorphous carbon material prior to treatment may have a high modulus and high hardness. In some implementations, the modulus is at least about 100 GPa, or between about 100 GPa and about 300 GPa. In some implementations, the hardness is at least about 10 GPa, or between about 10 GPa and about 30 GPa. For example, a diamond-like carbon film can have a modulus between about 140 GPa and about 160 GPa and a hardness between about 14 GPa and about 20 GPa.

Deposition conditions and parameters may affect other film properties of the deposited amorphous carbon material. Such film properties may include but are not limited to density, refractive index, extinction coefficient, and compressive stress. Some of these film properties may be correlated with etch selectivity of the amorphous carbon material. In some implementations, a density of the amorphous carbon material is at least about 1.6 g/cm$^3$, or between about 1.6 g/cm$^3$ and about 2.6 g/cm$^3$. In some implementations, a refractive index of the amorphous carbon material is at least about 2.0, or between about 2.0 and about 2.5. Table II shows film properties of an example amorphous carbon material prior to treatment. The amorphous carbon material may be a type of diamond-like carbon film with higher modulus and refractive index.

TABLE II

| Film Properties | Values |
| --- | --- |
| Hydrogen content (at. %) | 28 |
| sp3 carbon bonding (%) | 40 |
| Density (g/cm$^3$) | 2.1 |
| Stress (MPa) | −1120 |
| Refractive index | 2.28 |
| Hardness (GPa) | 17 |
| Young's modulus (GPa) | 153 |
| Etch rate in oxide etch (Å/min) | 403 |
| Etch selectivity to OPOP | 2.4 |

An etch resistance of the amorphous carbon material can be measured by its etch rate in a plasma-based oxide etch. The plasma-based oxide etch may include one or more fluorocarbons as etchant. Example process parameters for a plasma-based oxide etch is shown below in Table III. Prior to treatment, the etch rate of the amorphous carbon material can be greater than about 300 Å/m, or between about 300 Å/mm and about 500 Å/min. Moreover, the etch selectivity of the amorphous carbon material prior to treatment can be between about 2:1 and about 4:1 relative to the materials of the one or more underlayers. For example, the amorphous carbon material prior to treatment can have an etch selectivity of 2.4:1 relative to an OPOP stack.

TABLE III

| Pressure | TCP | Bias | Time | C$_4$F$_6$ | NF$_3$ | O$_2$ | Ar | Temp |
| --- | --- | --- | --- | --- | --- | --- | --- | --- |
| 1-20 Torr | 100-2000 W | 5-500 W | 3-50 seconds | 5-100 sccm | 1-30 sccm | 5-100 sccm | 5-100 sccm | 20-100° C. |

Figure 3A:
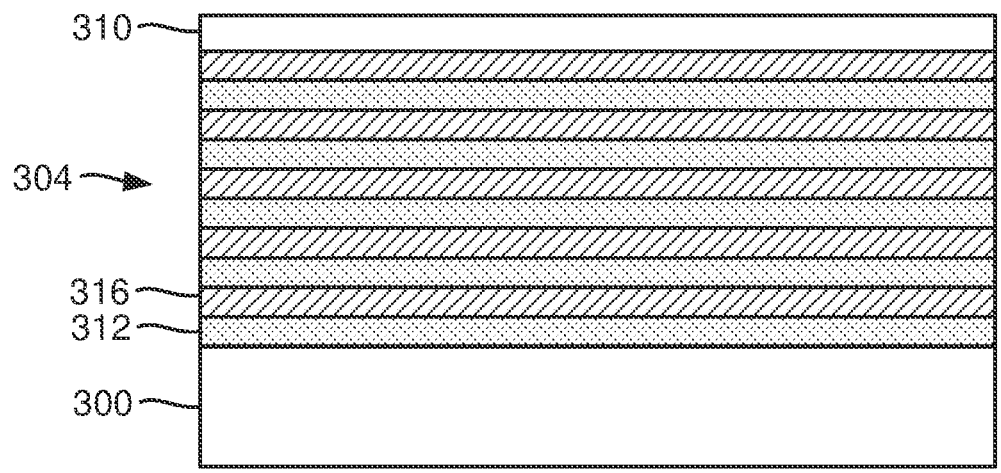
FIGS. 3A-3D show cross-sectional schematic illustrations of various stages in an example process flow of preparing an amorphous carbon hard mask according to some implementations.

FIG. 3A shows a cross-sectional schematic illustration of an example amorphous carbon layer deposited over a film stack. A film stack 304 may be formed on a substrate 300. In some implementations, the film stack 304 may include alternating layers of materials, where layers of a first material 312 are alternatingly disposed or interleaved between layers of a second material 316. For example, the film stack 304 can include an OPOP stack or an ONON stack. Each of the layers of first material 312 and the layers of the second material 316 may have a thickness between about 5 nm and about 100 nm, between about 10 nm and about 50 nm, or between about 15 nm and about 35 nm. In some implementations, the total number of layers in the film stack 304 may be at least about 10 layers, at least about 20 layers, at least about 30 layers, at least about 40 layers, at least about 50 layers, at least about 60 layers, at least about 70 layers, or at least about 80 layers. An amorphous carbon layer 310 may be deposited over the film stack 304. The amorphous carbon layer 310 may be deposited using any suitable deposition technique such as PECVD. Deposition parameters and conditions as described above may be controlled to influence various mechanical, optical, and chemical properties of the amorphous carbon layer 310. In some implementations, the amorphous carbon layer 310 is deposited at a low temperature, where the low temperature may be between about 100° C. and about 225° C. In some implementations, the amorphous carbon layer 310 may have a hydrogen content of at least about 20 atomic %, or between about 20 atomic % and about 50 atomic %. In some implementations, a thickness of the amorphous carbon layer 310 is between about 1 nm and about 10 nm.

Returning to FIG. 2, at block 220 of the process 200, the amorphous carbon material is exposed to an inert gas plasma at an elevated treatment temperature greater than the deposition temperature in the plasma deposition chamber. After deposition, the amorphous carbon material is treated by dual plasma-thermal mechanism for implanting inert gas species in the amorphous carbon material at an elevated treatment temperature. In some implementations, the inert gas plasma includes ions and/or radicals of helium (He), neon (Ne), argon (Ar), krypton (Kr), or xenon (Xe). In some implementations, the inert gas plasma includes ions and/or radicals of argon. The treatment at block 220 may be performed in the same plasma deposition chamber as deposition at block 210 so that the operations may be performed without introducing a vacuum break. In some implementations, treatment and deposition are performed in the same PECVD chamber.

Treatment of the amorphous carbon material includes thermal treatment. The amorphous carbon material is exposed to an elevated treatment temperature that is greater than the deposition temperature. For instance, the elevated treatment temperature may be at least 1.5 times greater or at least 2 times greater than the deposition temperature. In some implementations, the elevated treatment temperature is between about 200° C. and about 800° C., between about 250° C. and about 700° C., or between about 250° C. and about 650° C. In some implementations, the substrate may be transferred to a heated pedestal in the plasma deposition chamber to expose the amorphous carbon material to the elevated treatment temperature, or a pedestal on which the substrate rests is heated to the elevated treatment temperature.

By itself, thermal treatment of the amorphous carbon material reduces hydrogen content and reduces sp3 carbon bonding in the amorphous carbon material. However, thermal treatment by itself can degrade mechanical properties by reducing a modulus and hardness of the amorphous carbon material. In addition, thermal treatment by itself can degrade optical properties by reducing a refractive index of the amorphous carbon material.

Thermal treatment is combined with plasma treatment at block 220. The plasma treatment exposes the substrate to inert gas plasma so that inert gas species can be implanted in the amorphous carbon material. In some implementations, the amorphous carbon material is doped with an inert gas species at a dopant concentration of at least about 0.05 atomic %, at least about 0.1 atomic %, at least about 0.5 atomic %, or between about 0.5 atomic % and about 2 atomic %. Without transferring to another tool platform or chamber for implantation, the amorphous carbon material may be doped with inert gas species using the same plasma deposition chamber as depositing the amorphous carbon material. In particular, hydrocarbon precursor flow may be ceased and inert gas flow may be supplied in the plasma deposition chamber. Plasma is ignited so that plasma-activated species of inert gas is implanted into the amorphous carbon material.

Various treatment conditions and parameters may be controlled during implantation of inert gas species. In some implementations, a flow rate of the inert gas species is between at least about 3000 sccm, or between about 4000 sccm and about 6000 sccm. The plasma deposition chamber can be maintained at a relatively low pressure environment during treatment. In some implementations, a pressure in the plasma deposition chamber is at least 0.3 Torr, or between about 0.3 Torr and about 12 Torr. RF power may be delivered to the plasma deposition chamber for generating inert gas plasma. The RF power applied during treatment may be greater than the RF power applied during deposition. In some implementations, the low frequency component applies a power between about 500 W and about 4000 W or between about 1500 W and about 2500 W. In some implementations, the high frequency component applies a power between about 300 W and about 2000 W or between about 600 W and about 1000 W.

Table IV shows an example of treatment conditions and parameters for exposing amorphous carbon material to inert gas plasma treatment and thermal treatment.

TABLE IV

| Parameters | Values |
| --- | --- |
| $C_2H_2$ (sccm) | 0 |
| Ar (sccm) | 4000-6000 |
| $N_2$ (sccm) | 0 |
| Pressure (Torr) | 0.3-12 |
| Temperature (° C.) | 250-650 |
| RF HF (W) | 600-1000 |
| RF LF (W) | 1500-2500 |

Implantation of inert gas species may further reduce hydrogen content in the amorphous carbon material. Without being limited by any theory, inert gas implantation may enhance thermal effusion of hydrogen by displacement and sputtering. Thus, the combination of plasma and thermal treatment can significantly reduce hydrogen content in the amorphous carbon material. In some implementations, hydrogen content in the amorphous carbon material is reduced by at least about 5 atomic % after treatment. For example, where the amorphous carbon material starts at a hydrogen content of about 25-30 atomic %, the hydrogen content is reduced to about 15-20 atomic % following treatment.

Implantation of inert gas species may further reduce sp3 carbon bonding in the amorphous carbon material. In other words, whereas thermal treatment alone reduces sp3 carbon bonding in the amorphous carbon material, the combination of plasma and thermal treatment reduces sp3 carbon bonding in the amorphous carbon material even more. However, the inert gas plasma treatment does not necessarily degrade mechanical properties by further reducing hardness and modulus, or degrade optical properties by further reducing refractive index. Surprisingly, the combination of plasma and thermal treatment actually improves mechanical and optical properties when compared to thermal treatment alone. The decreased sp3 carbon bonding from inert gas plasma treatment did not correspondingly lead to additional decreases in modulus, hardness, and refractive index. Rather, it is believed the inert gas plasma treatment offset or counteracted decreases in modulus, hardness, and refractive index that would otherwise have occurred from the thermal treatment. Thus, combination of plasma and thermal treatment did not degrade the mechanical properties or optical properties of the amorphous carbon material by a significant amount. In some implementations, the post-treated amorphous carbon material maintains a hardness at least within +20% of an original hardness value of the amorphous carbon material, and maintains a modulus at least within +20% of the original modulus value of the amorphous carbon material. In some implementations, the post-treated amorphous carbon material maintains a refractive index at least within ±1% of the original refractive index of the amorphous carbon material.

The combination of the inert gas plasma treatment and thermal treatment significantly reduces hydrogen content and sp3 carbon bonding without compromising mechanical properties (e.g., hardness and modulus) and optical properties (e.g., refractive index). Typically, treatment of amorphous carbon material results in a tradeoff between hydrogen content and mechanical/optical properties, where reductions in hydrogen content would adversely impact mechanical/optical properties. Without being limited by any theory, the combination of the inert gas plasma treatment and the thermal treatment resulted in a phase change in the amorphous carbon material. Even with fewer sp3 carbon bonding in the amorphous carbon material, increased sp2 carbon bonding in the amorphous carbon material may be more cross-linked as opposed to graphitic. This type of sp2 carbon bonding may enable the amorphous carbon material to retain its hardness and modulus after treatment.

The combination of the inert gas plasma treatment and thermal treatment increases an etch resistance of the amorphous carbon material. In some implementations, the amorphous carbon material exhibits increased etch resistance to a plasma-based etch for removal of oxide and/or nitride. In some implementations, the plasma-based etch is suitable for etching materials of the one or more underlayers of the substrate. The treated amorphous carbon material may have an etch rate decrease by at least about 10%, by at least about 20%, or by at least about 30%. As shown in Table V below, an etch rate of the amorphous carbon material showed a 30% decrease in a plasma-based etch for removal of oxide. An increased etch resistance correlates to increased etch selectivity. Hence, exposing the amorphous carbon material to plasma and thermal treatment increases the etch selectivity of the amorphous carbon material relative to the one or more underlayers of the substrate.

Implantation of inert gas species in the amorphous carbon material may be limited by a thickness of the amorphous carbon material. Depth penetration of the inert gas species reduces at greater depths along the amorphous carbon material. This means that the inert gas species may be more concentrated near a surface of the amorphous carbon material, but less concentrated at further depths of the amorphous carbon material. Beyond a certain depth or thickness, the concentration of inert gas species may be negligible or zero. Thus, the amorphous carbon material may be deposited to a thickness that permits sufficient depth penetration of the inert gas species in the amorphous carbon material. That way, inert gas species may be implanted along an entirety or substantial entirety of the amorphous carbon material. In some implementations, a thickness of the amorphous carbon material is between about 1 nm and about 10 nm. The conditions for inert gas implantation may not be sufficient at greater thicknesses of the amorphous carbon material.

Figure 3B:
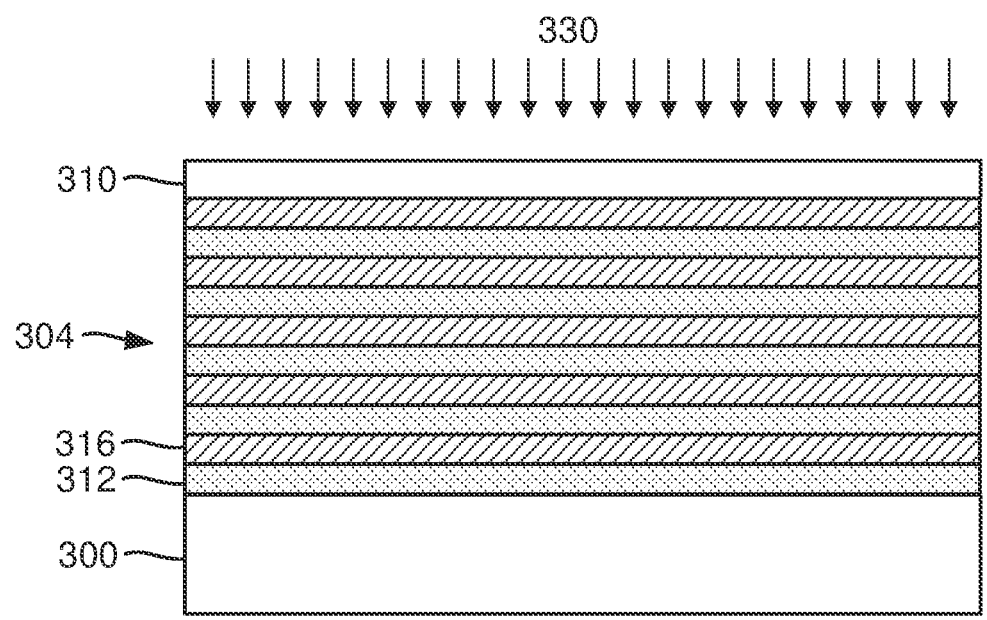

FIG. 3B shows a cross-sectional schematic illustration of the amorphous carbon layer in FIG. 3A being exposed to a dual plasma-thermal treatment. The amorphous carbon layer 310 is exposed to a dual plasma-thermal treatment 330, where the dual plasma-thermal treatment 330 comprises exposing the amorphous carbon layer 310 to inert gas plasma for implantation of inert gas species and exposing the amorphous carbon layer 310 to an elevated temperature. For example, the inert gas species may include argon. In some implementations, the elevated temperature is greater than a temperature in which the amorphous carbon layer 310 is deposited. For example, the elevated temperature may be between about 250° C. and about 650° C., and the temperature in which the amorphous carbon layer 310 is deposited may be between about 100° C. and about 225° C. In some implementations, the dual plasma-thermal treatment 330 is performed in the same plasma chamber as deposition of the amorphous carbon layer 310. The conditions of the dual plasma-thermal treatment 330 may be controlled to reduce hydrogen content and sp3 carbon bonding in the amorphous carbon layer 310. However, the conditions of the dual plasma-thermal treatment 330 may be controlled to largely retain the mechanical properties in the amorphous carbon layer 310.

Figure 4:
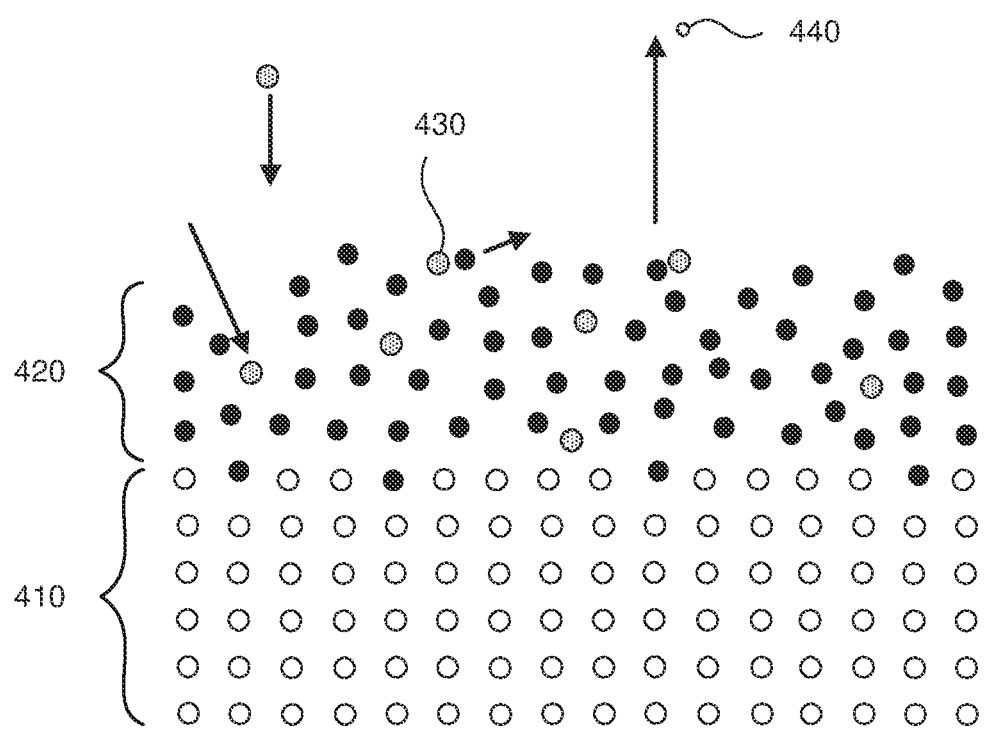
FIG. 4 shows a schematic illustration of inert gas implantation in an amorphous carbon material according to some implementations.

FIG. 4 shows a schematic illustration of inert gas implantation in an amorphous carbon material according to some implementations. An amorphous carbon material 420 is deposited over a substrate 410. The substrate 410 may be highly crystalline while the amorphous carbon material 420 is highly amorphous. An inert gas plasma may be ignited to cause the amorphous carbon material 420 to be exposed to ions and/or radicals of inert gas 430. The inert gas 430 may be implanted in the amorphous carbon material 420. The implantation of the inert gas 430 may cause effusion of hydrogen 440 from the amorphous carbon material 420 by displacement and sputtering, thereby reducing hydrogen content in the amorphous carbon material 420.

Figure 5A:
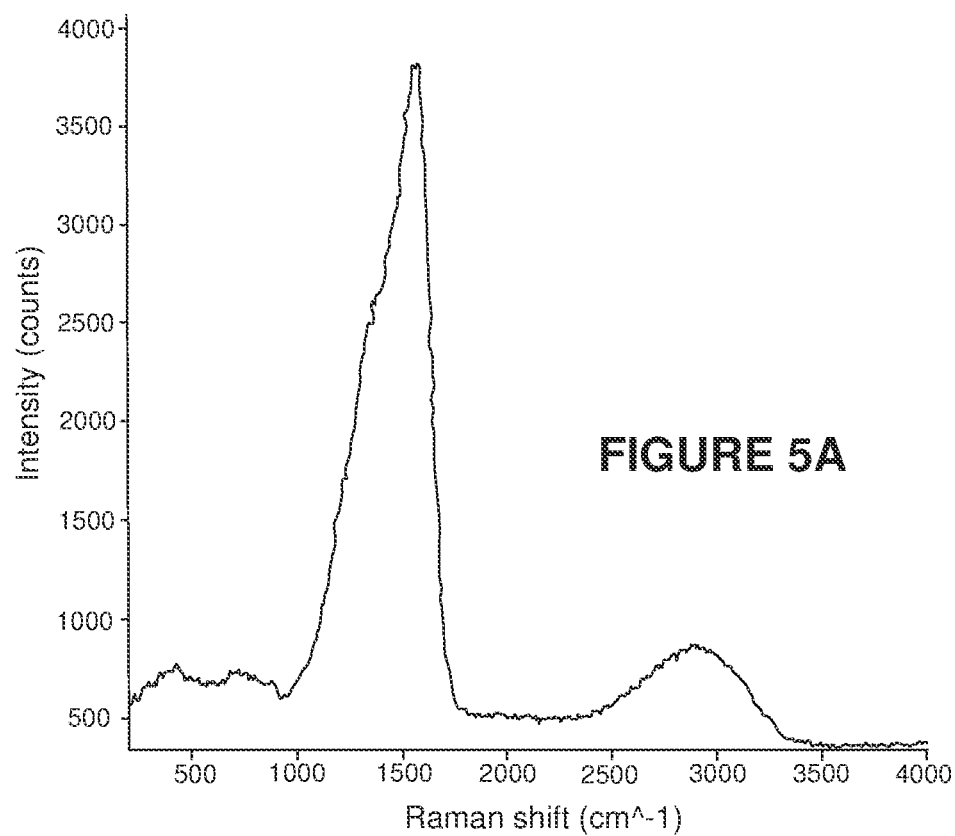
FIG. 5A illustrates a graph showing a Raman spectrum of an amorphous carbon hard mask after a thermal anneal at an elevated temperature of 400° C.
Figure 5B:
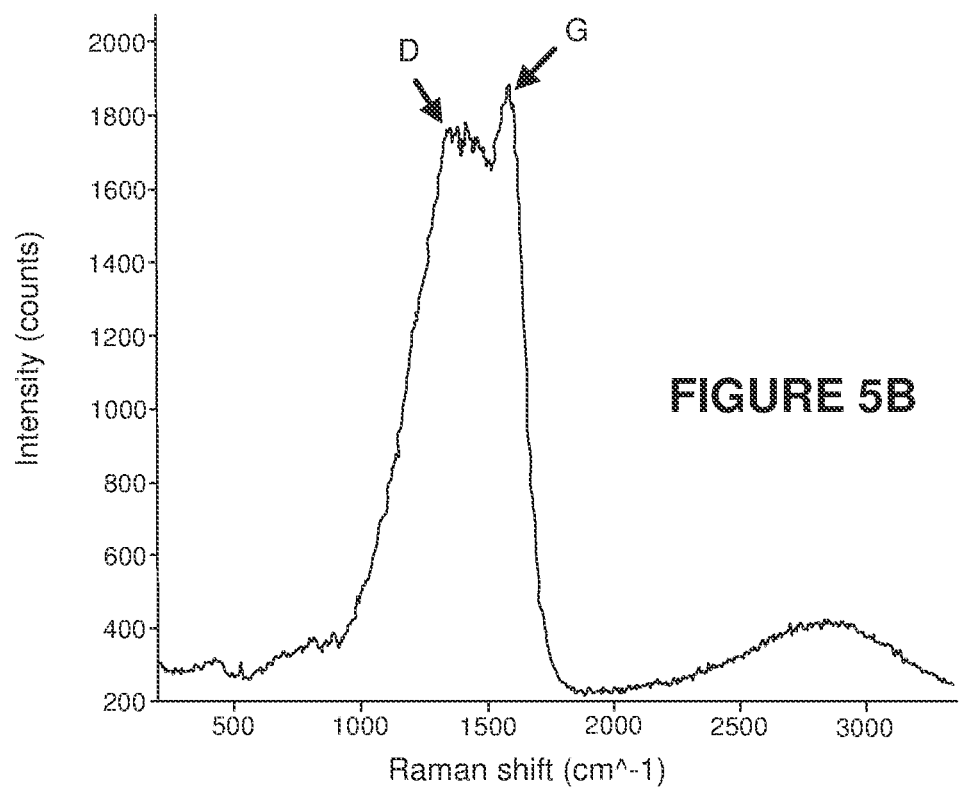
FIG. 5B illustrates a graph showing a Raman spectrum of an amorphous carbon hard mask after argon implantation at an elevated temperature of 400° C.

FIG. 5A illustrates a graph showing a Raman spectrum of an amorphous carbon hard mask after a thermal anneal at an elevated temperature of 400° C. FIG. 5B illustrates a graph showing a Raman spectrum of an amorphous carbon hard mask after argon implantation at an elevated temperature of 400° C. In a Raman spectrum, a G peak can be characterized at approximately 1580 $cm^{-1}$ and a D peak can be characterized at approximately 1380 $cm^{-1}$. The G peak is a strong indicator of the presence of graphite, and the D peak is indicative of disorder in carbon. A ratio of the D peak to the G peak (ID/IG) can be indicative of the presence of sp2 carbon bonding. Specifically as ID/IG increases, sp2 carbon bonding in the amorphous carbon hard mask increases. The G peak is very high compared to the D peak in FIG. 5A, whereas the G peak is comparable to the D peak in FIG. 5B.

Accordingly, argon implantation at an elevated temperature of 400° C. results in increased sp2 carbon bonding in the amorphous carbon hard mask relative to only thermal anneal at 400° C.

Returning to FIG. 2, at block 230 of the process 200, operations of depositing amorphous carbon material and exposing the amorphous carbon material to inert gas plasma and elevated treatment temperature are repeated to achieve a desired thickness for an amorphous carbon hard mask. Operations of deposition and treatment are repeated in the plasma deposition chamber so that the substrate is not exposed to a vacuum break. Each deposition operation includes a low temperature deposition of amorphous carbon material at a relatively small thickness. The deposition operation is followed by a dual plasma-thermal treatment operation, where the dual plasma-thermal treatment operation includes high temperature inert gas implantation. In some implementations, operations of deposition and treatment are repeated at least 5 times, at least 10 times, at least 20 times, at least 30 times, or at least 50 times to achieve the desired thickness. The desired thickness of the amorphous carbon hard mask may be between about 5 nm and about 1500 nm, between about 10 nm and about 1000 nm, or between about 10 nm and about 500 nm.

Improved film properties of the treated amorphous carbon material discussed at block 220 are shared in the amorphous carbon hard mask at block 230. The film properties of the amorphous carbon hard mask may have reduced hydrogen content and reduced sp3 carbon bonding without compromising modulus and hardness, resulting in increased etch selectivity. Table V shows film properties comparing different samples of amorphous carbon hard masks: (i) before treatment, (ii) after thermal treatment alone and (iii) after both inert gas plasma treatment and thermal treatment. As shown in Table V, hydrogen content and sp3 carbon bonding decreased after both inert gas plasma treatment and thermal treatment, but modulus and hardness did not significantly decrease. Furthermore, the treated amorphous carbon material exhibited a 30% decrease in etch rate in oxide etch. In comparison to thermal treatment alone, hydrogen content and sp3 carbon bonding slightly decreased but to a lesser degree than both inert gas plasma treatment and thermal treatment. However, modulus and hardness significantly decreased with thermal treatment alone.

TABLE V

| Film Properties | Values - before treatment | Values - thermal treatment alone | Values - inert gas plasma treatment and thermal treatment |
|---|---|---|---|
| Hydrogen content (at. %) | 28 | 26 | 19 |
| sp3 carbon bonding (%) | 40 | 30 | 20 |
| Density (g/cm$^3$) | 2.1 | 1.88 | 2.4 |
| Stress (MPa) | −1120 | −615 | −390 |
| Refractive index | 2.28 | 2.26 | 2.33 |
| Hardness (GPa) | 17 | 10 | 14 |
| Young's modulus (GPa) | 153 | 71 | 135 |
| Etch rate in oxide etch (Å/min) | 403 | — | 280 |

Figure 3C:
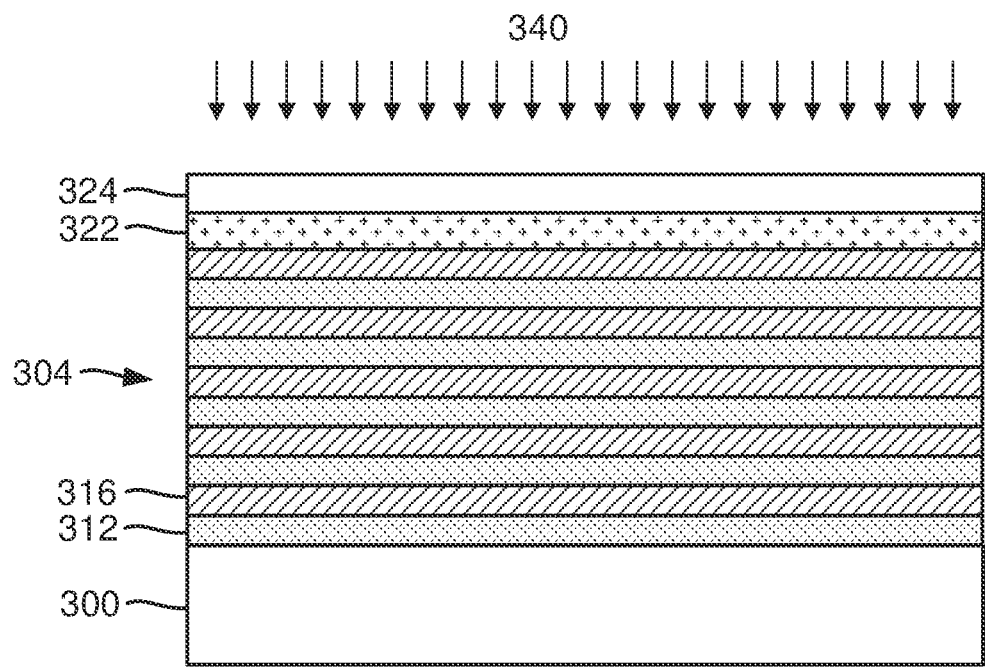

FIG. 3C shows a cross-sectional schematic illustration of the amorphous carbon layer treated in FIG. 3B with an additional amorphous carbon layer deposited thereon. After treatment, the amorphous carbon layer 310 is converted to a treated amorphous carbon layer 322. The treated amorphous carbon layer 322 has implanted inert gas species and reduced hydrogen content. Furthermore, the treated amorphous carbon layer 322 has increased etch selectivity. An additional amorphous carbon layer 324 is deposited on the treated amorphous carbon layer 322. The additional amorphous carbon layer 324 may be identical or substantially similar in thickness and composition with the amorphous carbon layer 310, where the additional amorphous carbon layer 324 may be deposited under the same or substantially similar conditions as the amorphous carbon layer 310. The additional amorphous carbon layer 324 may undergo a dual plasma-thermal treatment 340, where the dual plasma-thermal treatment 340 is the same treatment as the dual plasma-thermal treatment 330.

Figure 3D:
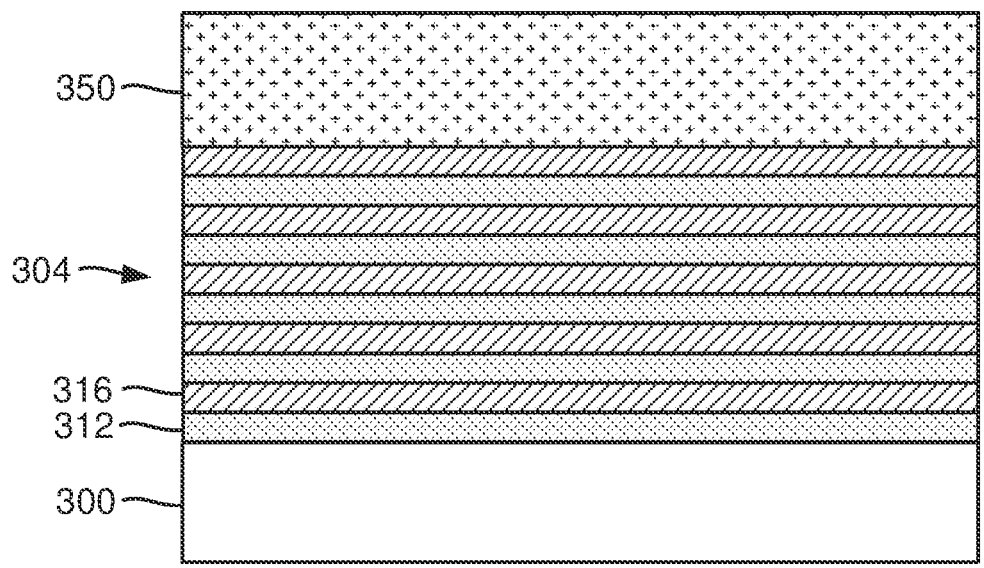

FIG. 3D shows across-sectional schematic illustration of anamorphous carbon hard mask structure after multiple cycles of deposition and treatment in FIGS. 3A-3C. The amorphous carbon hard mask structure 350 is formed after deposition and treatment of multiple layers of amorphous carbon. The multiple cycles of deposition and treatment are performed in the plasma chamber or tool platform. The amorphous carbon hard mask structure 350 has implanted inert gas species, reduced hydrogen content, reduced sp3 carbon bonding, and increased etch selectivity relative to the film stack 304. The amorphous carbon hard mask structure 350 retains a high modulus and hardness. The amorphous carbon hard mask structure 350 has a desired thickness for an amorphous carbon hard mask.

Returning to FIG. 2, at block 240 of the process 200, the amorphous carbon material is optionally patterned to form the amorphous carbon hard mask. In some implementations, the amorphous carbon material is patterned using conventional lithography techniques.

At block 250 of the process 200, one or more underlayers below the amorphous carbon hard mask are etched using a plasma-based etchant. The amorphous carbon hard mask is highly resistant to the plasma-based etchant so that the amorphous carbon hard mask is substantially preserved during etching. In some implementations, the etch selectivity of the amorphous carbon hard mask is at least 4:1, at least 5:1, or at least 6:1 relative to the materials of the one or more underlayers. In some implementations, the one or more underlayers are etched to form high aspect ratio features. The high aspect ratio features may have a depth to lateral dimension of at least about 10:1, at least about 20:1, at least about 30:1, at least about 40:1, at least about 50:1, or at least about 100:1. In some implementations, the plasma-based etch may have a chemistry that includes one or more fluorocarbons. Other chemistries may be used.

Figure 6:
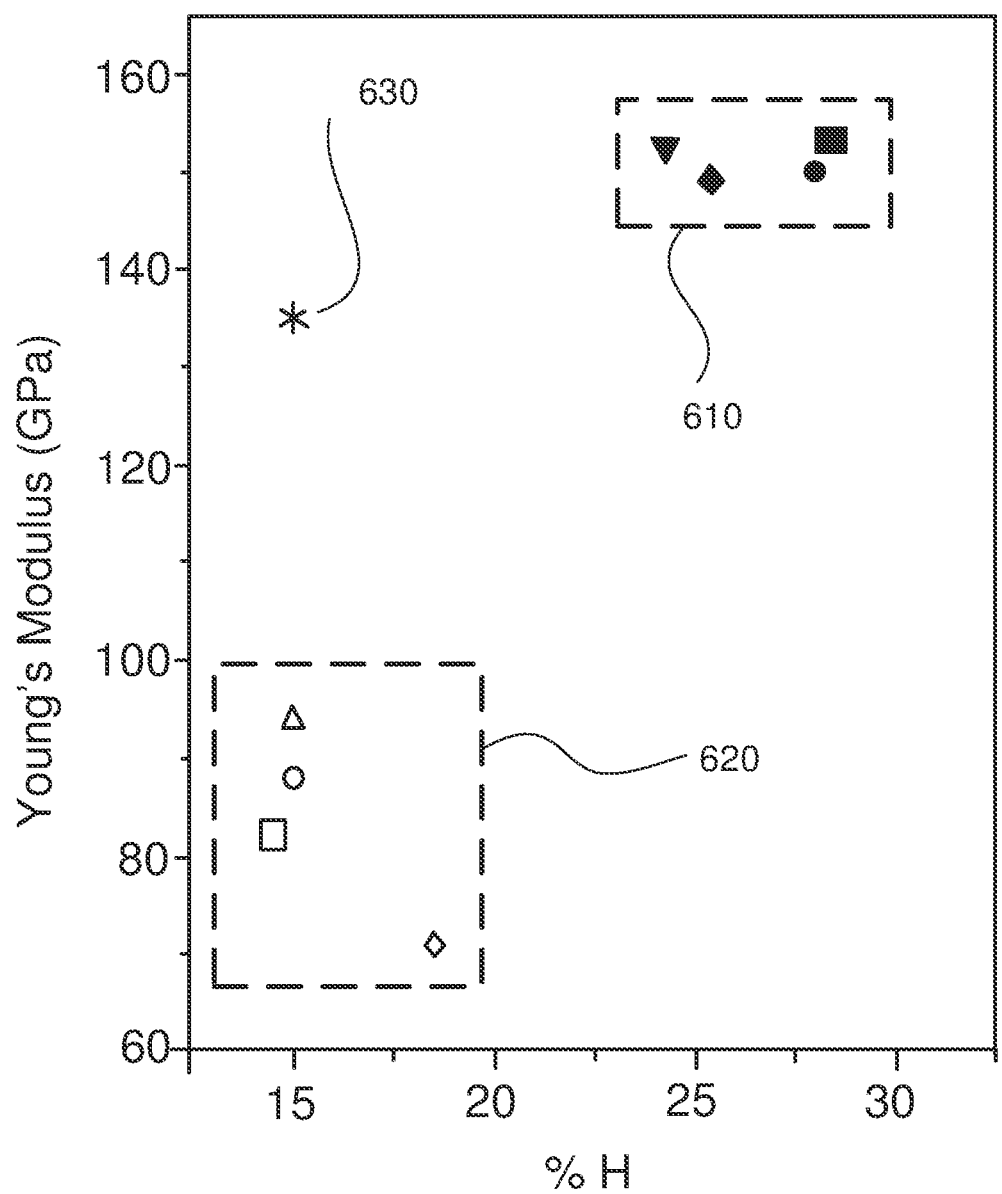
FIG. 6 illustrates a plot of Young's modulus and hydrogen concentration for an amorphous carbon hard mask treated with inert gas implantation at an elevated temperature against other conventional amorphous carbon hard masks.

FIG. 6 illustrates a plot of Young's modulus and hydrogen concentration for an amorphous carbon hard mask treated with inert gas implantation at an elevated temperature against other conventional amorphous carbon hard masks. Some conventional amorphous carbon hard masks are formed with a high Young's modulus but with high hydrogen concentration. Such amorphous carbon hard masks are depicted in a high modulus and high hydrogen regime 610. An example of an amorphous carbon hard mask in the high modulus and high hydrogen regime 610 is diamond-like carbon. Some conventional amorphous carbon hard masks are formed with a low hydrogen concentration but with a low Young's modulus. Such amorphous carbon hard masks are depicted in the low modulus and low hydrogen regime 620. An example of an amorphous carbon hard mask in the low modulus and low hydrogen regime 620 is thermally annealed diamond-like carbon. The amorphous carbon hard mask of the present disclosure exhibits a high Young's modulus and low hydrogen concentration. The amorphous carbon hard mask is depicted in the high modulus and low hydrogen regime 630. The amorphous carbon hard mask in the high modulus and low hydrogen regime 630 is treated with plasma and thermal treatment as described in the present disclosure.

The amorphous carbon hard mask of the present disclosure achieves reduced hydrogen content and sp3 carbon bonding while retaining high modulus and hardness. Such film properties contrast with typical amorphous carbon hard masks including diamond-like carbon films. In some implementations, the amorphous carbon hard mask of the present disclosure has a hydrogen content equal to or less than about 20 atomic %, or between about 15 atomic % and about 20 atomic %. In addition, the amorphous carbon hard mask of the present disclosure may have a modulus between about 100 GPa and about 200 GPa, between about 120 GPa and about 180 GPa, or between about 140 GPa and about 170 GPa. Furthermore, the amorphous carbon hard mask of the present disclosure may have a hardness between about 10 GPa and about 25 GPa, between about 10 GPa and about 20 GPa, or between about 12 GPa and about 18 GPa. An amount of sp3 carbon bonding in the amorphous carbon material in the present disclosure may be equal to or less than about 25%, between about 10% and about 25%, or between about 15% and about 25%, such as 20%. The amorphous carbon hard mask may be doped with an inert gas species. In some implementations, a dopant concentration of the inert gas species in the amorphous carbon hard mask is at least about 0.05 atomic %, at least about 0.1 atomic %, at least about 0.5 atomic %, or between about 0.5 atomic % and about 2 atomic %. In some implementations, the inert gas species is argon.

The amorphous carbon hard mask is formed by a series of deposition and treatment operations. Deposition of an amorphous carbon layer is performed at a low temperature in a plasma deposition chamber, where the low temperature can be between about 100° C. and about 225° C. Treatment of the amorphous carbon layer is performed at a high temperature in the same plasma deposition chamber, where the high temperature can be between about 250° C. and about 650° C. Treatment of the amorphous carbon layer further includes inert gas plasma treatment in the same plasma deposition chamber, where the inert gas plasma treatment implants inert gas species in the amorphous carbon layer. Deposition and treatment operations are repeated multiple times to achieve a desired thickness for the amorphous carbon hard mask.

Apparatus

Figure 7:
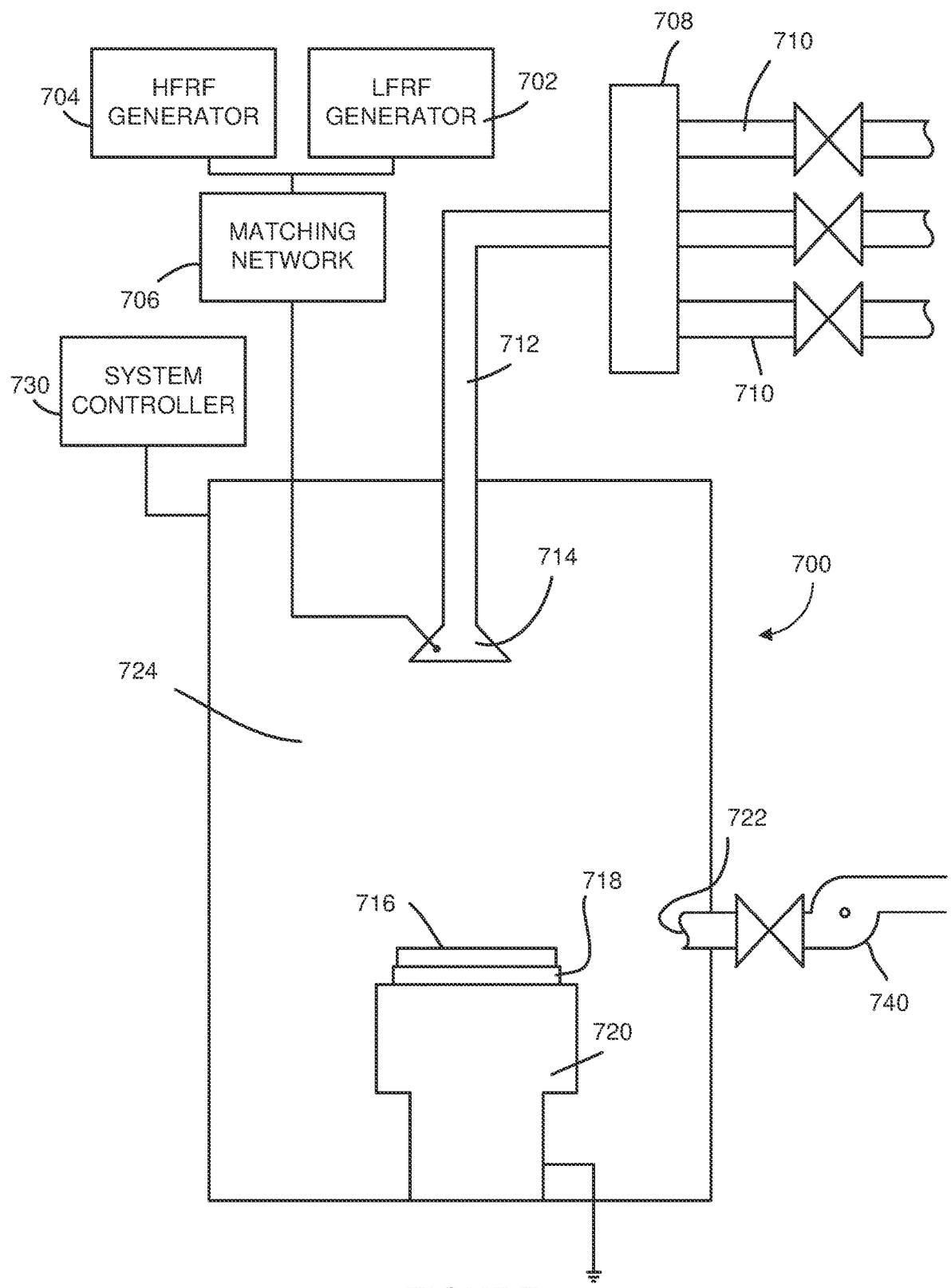
FIG. 7 shows a schematic diagram of an example plasma processing apparatus for depositing amorphous carbon material and treating the amorphous carbon material with inert gas implantation according to some implementations.

FIG. 7 shows a schematic diagram of an example plasma processing apparatus for depositing amorphous carbon material and treating the amorphous carbon material with inert gas implantation according to some implementations. A plasma processing apparatus 700 includes a plasma reactor 724 with a container or space for confining plasma therein. The plasma may be generated by a capacitive-discharge type system including a showerhead 714 working in conjunction with a grounded heater block 720. A high frequency (HF) radio frequency (RF) generator 704 and a low frequency (LF) RF generator 702 may be connected to a matching network 706 and to the showerhead 714. The power and frequency supplied by matching network 706 may be sufficient to generate a plasma from process gases supplied to the plasma reactor 724. For example, the matching network 706 may provide 50 W to 2000 W of HFRF power. In some examples, the matching network 706 may provide 100 W to 5000 W of HFRF power and 100 W to 5000 W of LFRF power total energy. In a typical process, the HFRF component may generally be between 5 MHz to 60 MHz, e.g., 13.56 MHz. In operations where there is an LF component, the LF component may be from about 100 kHz to 2 MHz, e.g., 430 kHz.

Within the reactor, a wafer pedestal 718 may support a substrate 716. The wafer pedestal 718 may include a chuck, a fork, or lift pins (not shown) to hold and transfer the substrate during and between the deposition and/or plasma treatment reactions. The chuck may be an electrostatic chuck, a mechanical chuck, or various other types of chuck as are available for use in the industry and/or for research.

Various process gases may be introduced via inlet 712. Multiple source gas lines 710 are connected to manifold 708. The gases may be premixed or not. Appropriate valving and mass flow control mechanisms may be employed to ensure that the correct process gases are delivered during the deposition and plasma treatment phases of the process. In the case where a chemical precursor(s) is delivered in liquid form, liquid flow control mechanisms may be employed. Such liquids may then be vaporized and mixed with process gases during transportation in a manifold heated above the vaporization point of the chemical precursor supplied in liquid form before reaching the deposition chamber.

Process gases may exit the plasma reactor 724 via an outlet 722. A vacuum pump, e.g., a one or two stage mechanical dry pump and/or turbomolecular pump 740, may be used to draw process gases out of the plasma reactor 724 and to maintain a suitably low pressure within the plasma reactor 724 by using a closed-loop-controlled flow restriction device, such as a throttle valve or a pendulum valve.

In some implementations, a controller 730 (which may include one or more physical or logical controllers) controls some or all of the operations of the plasma processing apparatus 700. The controller 730 may be configured to control at least the power supply including the HFRF generator 704 and the LFRF generator 702, the showerhead 714, the wafer pedestal 718, the turbomolecular pump 740, and the multiple gas lines 710 and the manifold 708. The controller 730 may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the controller 730 or they may be provided over a network. In certain embodiments, the controller 730 executes system control software.

The system control software may include instructions for controlling the timing of application and/or magnitude of any one or more of the following chamber operational conditions: the mixture and/or composition of gases, chamber pressure, chamber temperature, substrate/substrate support temperature, the bias applied to the substrate (which in various implementations may be zero), the frequency and power applied to electrodes or other plasma generation components, substrate position, substrate movement speed, and other parameters of a particular process performed by the tool. System control software may be configured in any suitable way. For example, various process tool component subroutines or control objects may be written to control operations of the process tool components necessary to carry out various process tool processes. System control software may be coded in any suitable compute readable programming language.

In some embodiments, system control software includes input/output control (IOC) sequencing instructions for controlling the various parameters described herein. For example, each phase of a semiconductor fabrication process may include one or more instructions for execution by the controller 730. The instructions for setting process conditions for a phase may be included in a corresponding recipe phase, for example. In some implementations, the recipe phases may be sequentially arranged, such that steps in an etching process are executed in a certain order for that process phase. For example, a recipe may be configured to perform deposition of amorphous carbon by PECVD followed by treatment of the amorphous carbon with inert gas plasma at high temperatures. Specifically, the recipe may be configured to perform multiple deposition and treatment operations to form an amorphous carbon hard mask with improved selectivity.

In some cases, the controller 730 controls gas concentrations, substrate movement, and/or the power supplied to the electrodes (e.g., wafer pedestal 718 and showerhead 714). The controller 730 may control the gas concentration by, for example, opening and closing relevant valves to produce one or more inlet gas streams that provide the necessary reactant(s) at the proper concentration(s). The substrate movement may be controlled by, for example, directing a substrate positioning system to move as desired. The power supplied to the electrodes may be controlled to provide particular RF power levels. Similarly, if an internal grid is used, any RF power applied to the grid may be adjusted by the controller 730. The controller 730 may control these and other aspects based on sensor output (e.g., when power, potential, pressure, etc. reach a certain threshold), the timing of an operation (e.g., opening valves at certain times in a process), or based on received instructions from the user.

In some implementations, the controller 730 is configured with instructions for performing one or more of the following operations: depositing an amorphous carbon material on a substrate 716 in the plasma reactor 724 at a deposition temperature, exposing the amorphous carbon material to an inert gas plasma at an elevated treatment temperature in the plasma reactor 724, and repeating operations of depositing amorphous carbon material and exposing the amorphous carbon material to inert gas plasma at an elevated treatment temperature to achieve a desired thickness for an amorphous carbon hard mask. The deposition temperature is less than the elevated treatment temperature. In some implementations, the deposition temperature is between about 100° C. and about 225° C. and the elevated treatment temperature is between about 250° C. and about 650° C.

In some implementations, the controller 730 is part of a system, which may be part of the examples described herein. Such systems can comprise semiconductor processing equipment, including a processing tool or tools, chamber or chambers, a platform or platforms for processing, and/or specific processing components (a substrate pedestal, a gas flow system, etc.). These systems may be integrated with electronics for controlling their operation before, during, and after processing of a semiconductor wafer or substrate. The electronics may be referred to as the "system controller" or "controller," which may control various components or subparts of the system or systems. The controller 730, depending on the processing requirements and/or the type of system, may be programmed to control any of the processes disclosed herein, including the delivery of processing gases, temperature settings (e.g., heating and/or cooling), pressure settings, vacuum settings, power settings, RF generator settings, RF matching circuit settings, frequency settings, flow rate settings, fluid delivery settings, positional and operation settings, substrate transfers into and out of a tool and other transfer tools and/or load locks connected to or interfaced with a specific system.

Figure 8:
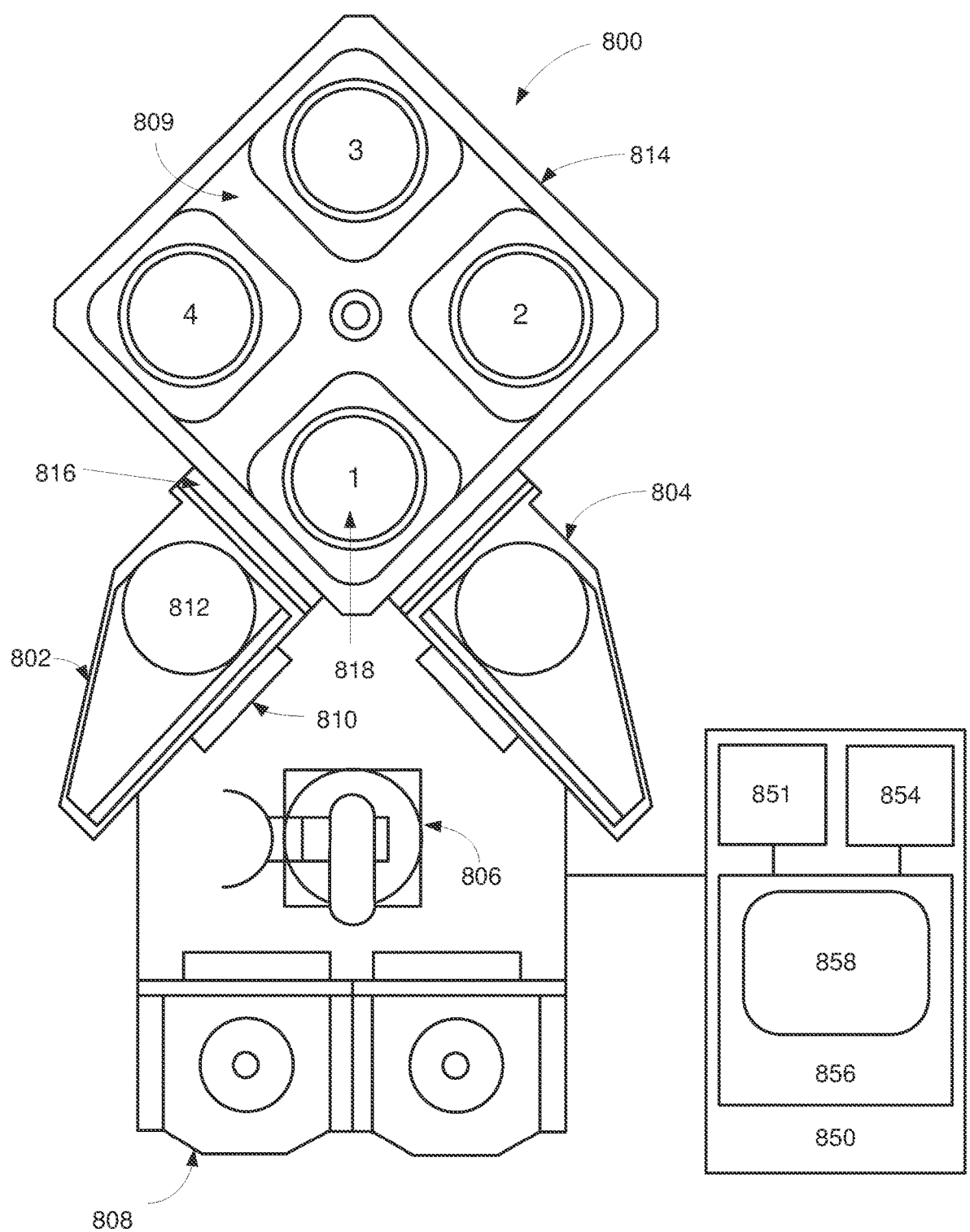
FIG. 8 shows a schematic diagram of an example process tool for performing disclosed implementations.

A plasma processing apparatus as described above may be part of a multi-station processing tool. FIG. 8 shows a schematic diagram of an example process tool for performing disclosed implementations. FIG. 8 shows an implementation of a multi-station process tool 800 with an inbound load lock 802 and an outbound load lock 804, either or both of which may include a plasma source. A robot 806 at atmospheric pressure is configured to move wafers from a cassette loaded through a pod 808 into inbound load lock 802 via an atmospheric port 810. A wafer is placed by the robot 806 on a pedestal 812 in the inbound load lock 802, the atmospheric port 810 is closed, and the load lock is pumped down. Where the inbound load lock 802 includes a plasma source, the wafer may be exposed to plasma to treat the wafer in the load lock prior to being introduced into a processing chamber 814. Further, the wafer also may be heated in the inbound load lock 802 as well, for example, to remove moisture and adsorbed gases. Next, a chamber transport port 816 to processing chamber 814 is opened, and another robot (not shown) places the wafer into the reactor on a pedestal of a first station shown in the reactor for processing. While the implementation depicted in FIG. 8 includes load locks, it will be appreciated that, in some implementations, direct entry of a wafer into a process station may be provided.

The depicted processing chamber 814 includes four process stations, numbered from 1 to 4 in the implementation shown in FIG. 8. Each station may have a heated pedestal (shown at 818 for station 1), and gas line inlets. It will be appreciated that in some implementations, each process station may have different or multiple purposes. For example, in some implementations, a process station may be switchable between PECVD and treatment with inert gas plasma. While the depicted processing chamber 814 includes four stations, it will be understood that a processing chamber according to the present disclosure may have any suitable number of stations. For example, in some implementations, a processing chamber may have five or more stations, while in other implementations a processing chamber may have three or fewer stations.

FIG. 8 depicts an implementation of a wafer handling system 890 for transferring wafers within processing chamber 814. In some implementations, wafer handling system 890 may transfer wafers between various process stations and/or between a process station and a load lock. It will be appreciated that any suitable wafer handling system may be employed. Non-limiting examples include wafer carousels and wafer handling robots. FIG. 8 also depicts an implementation of a system controller 850 employed to control process conditions and hardware states of the process tool 800. System controller 850 may include one or more memory devices 856, one or more mass storage devices 854, and one or more processors 852. Processor 852 may include a CPU or computer, analog, and/or digital input/output connections, stepper motor controller boards, etc.

In some implementations, system controller 850 controls all of the activities of the process tool 800. System controller 850 executes system control software 858 stored in mass storage device 854, loaded into memory device 856, and executed on processor 852. Alternatively, the control logic may be hard coded in the system controller 850. Applications Specific Integrated Circuits, Programmable Logic Devices (e.g., field-programmable gate arrays, or FPGAs)

and the like may be used for these purposes. In the following discussion, wherever "software" or "code" is used, functionally comparable hard coded logic may be used in its place. System control software 858 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by the process tool 800. System control software 858 may be configured in any suitable way. For example, various process tool component subroutines or control objects may be written to control operation of the process tool components used to carry out various process tool processes. System control software 858 may be coded in any suitable computer readable programming language.

In some embodiments, the system control software 858 may include input/output control (IOC) sequencing instructions for controlling the various parameters described above. Other computer software and/or programs stored on mass storage device 854 and/or memory device 856 associated with the system controller 850 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 818 and to control the spacing between the substrate and other parts of the process tool 800.

A process gas control program may include code for controlling gas composition and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with the system controller 850. The user interface may include a display screen, graphical software displays of the apparatus and/or process conditions, and user input devices such as pointing devices, keyboards, touch screens, microphones, etc.

In some embodiments, parameters adjusted by system controller 850 may relate to process conditions. Non-limiting examples include process gas composition and flow rates, temperature, pressure, plasma conditions (such as RF power levels), pressure, etc. These parameters may be provided to the user in the form of a recipe, which may be entered utilizing the user interface.

Signals for monitoring the process may be provided by analog and/or digital input connections of the system controller 850 from various process tool sensors. The signals for controlling the process may be output on the analog and digital output connections of the process tool 800. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 850 may provide program instructions for implementing the etching processes described herein. The etching processes may include one or more etch cycles each including non-selective and selective etch phases. The program instructions may control a variety of process parameters, such as DC power level, RF bias power level, pressure, temperature, etc. The instructions may control the parameters to operate etching of alternating layers of materials according to various embodiments described herein.

Broadly speaking, a controller or system controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the etching of one or more layers of materials of a substrate.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, a metrology chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of substrates to and from tool locations and/or load ports in a semiconductor manufacturing factory.

CONCLUSION

In the foregoing description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments are described in conjunction with the specific embodiments, it will be understood that it is not intended to limit the disclosed embodiments.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of preparing an amorphous carbon hard mask, the method comprising:
   (i) depositing amorphous carbon material on a substrate in a plasma deposition chamber at a deposition temperature;
   (ii) exposing the amorphous carbon material to an inert gas plasma at an elevated treatment temperature greater than the deposition temperature in the plasma deposition chamber, wherein the inert gas plasma comprises ions and/or radicals of helium, neon, argon, krypton, or xenon; and
   (iii) repeating operations (i) and (ii) to achieve a desired thickness for an amorphous carbon hard mask.

2. The method of claim 1, wherein the elevated treatment temperature is greater than the deposition temperature by a percentage increase between about 10% and about 550% from the deposition temperature.

3. The method of claim 1, wherein the amorphous carbon material has a hydrogen content of at least about 20 atomic % prior to exposure to the inert gas plasma and the elevated treatment temperature.

4. The method of claim 3, wherein exposing the amorphous carbon material to the inert gas plasma and the elevated treatment temperature reduces the hydrogen content by at least about 5 atomic %.

5. The method of claim 1, wherein exposing the amorphous carbon material to the inert gas plasma and the elevated treatment temperature increases an etch resistance of the amorphous carbon hard mask.

6. The method of claim 1, wherein exposing the amorphous carbon material to the inert gas plasma and the elevated treatment temperature reduces sp3 carbon bonding in the amorphous carbon material.

7. The method of claim 1, wherein exposing the amorphous carbon material to the inert gas plasma and the elevated treatment temperature maintains a hardness within ±20% of an original hardness of the amorphous carbon material and maintains a Young's modulus within ±20% of an original Young's modulus of the amorphous carbon material.

8. The method of claim 1, wherein a hardness of the amorphous carbon hard mask is between about 10 GPa and about 20 GPa and a Young's modulus of the amorphous carbon hard mask is between about 120 GPa and about 180 GPa.

9. The method of claim 1, wherein the amorphous carbon hard mask has a hydrogen content equal to or less than about 20 atomic %.

10. The method of claim 1, wherein the amorphous carbon hard mask is doped with an inert gas at a dopant concentration of at least about 0.1 atomic %.

11. The method of claim 1, further comprising:
    (iv) patterning the amorphous carbon material to form the amorphous carbon hard mask; and
    (v) etching one or more underlayers positioned below the amorphous carbon hard mask using a plasma-based etchant.

12. The method of claim 11, wherein the one or more underlayers includes alternating layers of oxide and nitride or alternating layers of oxide and polysilicon.

13. A plasma deposition apparatus comprising:
    a processing chamber;
    a substrate support for supporting a substrate in the processing chamber, wherein the substrate support is configured to be heated and biased; and
    a controller configured with instructions to perform the following operations:
    (i) deposit an amorphous carbon material on the substrate in the processing chamber at a deposition temperature;
    (ii) expose the amorphous carbon material to an inert gas plasma at an elevated treatment temperature greater than the deposition temperature in the processing chamber, wherein the inert gas plasma comprises ions and/or radicals of helium, neon, argon, krypton, or xenon; and
    (iii) repeat operations (i) and (ii) to achieve a desired thickness for an amorphous carbon hard mask.

14. The apparatus of claim 13, wherein the elevated treatment temperature is greater than the deposition temperature by a percentage increase between about 10% and about 550% from the deposition temperature.

* * * * *